United States Patent [19]

Mizushima et al.

[11] Patent Number: 5,448,097
[45] Date of Patent: Sep. 5, 1995

[54] INTERLAYER DIELECTRIC FILM, AND SEMICONDUCTOR DEVICE AND SOLID-STATE IMAGE PICKUP DEVICE USING THE SAME, AND METHOD OF MANUFACTURING THE SAME

[75] Inventors: Kazuyoshi Mizushima, Takatuki; Hiroyuki Okada, Osaka, both of Japan

[73] Assignee: Matsushita Electronics Corporation, Osaka, Japan

[21] Appl. No.: 20,297

[22] Filed: Feb. 19, 1993

[30] Foreign Application Priority Data

Feb. 20, 1992 [JP] Japan .................... 4-033069

[51] Int. Cl.6 .................... H01L 27/14; H01L 31/00
[52] U.S. Cl. .................... 257/435; 257/443; 257/461; 257/508; 257/644
[58] Field of Search ............ 257/435, 436, 443, 461, 257/508, 644

[56] References Cited

U.S. PATENT DOCUMENTS

| | | | |
|---|---|---|---|
| 4,123,565 | 10/1978 | Sumitomo et al. | 257/644 |
| 4,523,963 | 6/1985 | Ohta et al. | 257/644 |
| 4,545,852 | 10/1985 | Barton | 156/643 |
| 4,782,037 | 11/1988 | Tomozawa et al. | 257/644 |
| 4,879,253 | 11/1989 | Wakamatsu | 437/41 |
| 5,028,972 | 7/1991 | Watanabe et al. | 357/30 |
| 5,169,491 | 12/1992 | Doan | 156/636 |

FOREIGN PATENT DOCUMENTS

| | | |
|---|---|---|
| 0242663 | 10/1987 | European Pat. Off. . |
| 0353665 | 2/1990 | European Pat. Off. . |
| 0502521 | 9/1992 | European Pat. Off. . |
| 63-111668 | 5/1988 | Japan . |
| 63-174359 | 7/1988 | Japan .................... 257/435 |
| 2156670 | 6/1990 | Japan . |
| 3-190272 | 8/1991 | Japan .................... 257/435 |
| 4211120 | 8/1992 | Japan . |

*Primary Examiner*—Sara W. Crane
*Attorney, Agent, or Firm*—Rogers & Wells

[57] ABSTRACT

In the solid-state image pickup device of the invention, a photodiode is formed on a semiconductor substrate, and a transfer channel is formed at a specific gap to the photodiode. On the semiconductor substrate, a transfer gate electrode formed through a gate dielectric film is provided, and an interlayer film is formed on the transfer gate electrode. Furthermore, a first light-shield film for shielding the transfer channel from light is formed on the interlayer film. On the first light-shield film, a second light-shield film is formed at least through an interlayer dielectric film. In this case, the interlayer dielectric film is composed of multiple layers of at least first interlayer dielectric film and second interlayer dielectric film, and in etching of the interlayer dielectric film, the second interlayer dielectric film is smaller in the etching rate to the first interlayer dielectric film, and the second interlayer dielectric film is formed beneath the first interlayer dielectric film. As a result, by etching, for example, the second light-shield film on the interlayer dielectric film, the reduction of film thickness on the first interlayer dielectric film varies significantly. By such variation of film thickness reduction and owing to necessity of obtaining a specified interlayer dielectric breakdown voltage, the interlayer dielectric film may be reduced in thickness.

6 Claims, 6 Drawing Sheets

PRIOR ART

INTERLAYER DIELECTRIC FILM, AND SEMICONDUCTOR DEVICE AND SOLID-STATE IMAGE PICKUP DEVICE USING THE SAME, AND METHOD OF MANUFACTURING THE SAME

BACKGROUND OF THE INVENTION

1. Field of the Invention

The present invention relates to an interlayer dielectric film, a semiconductor device and a solid-state image pickup device using the same, and a method of manufacturing the same.

2. Description Of The Related Prior Art

The structure of a conventional semiconductor device is described below while referring to FIG. 9 as an example of sectional view of a solid-state image pickup device.

Impurities are selectively implanted in an N type semiconductor substrate 1, and a photodiode 2 and a transfer channel 3 are formed by thermal diffusion. The photodiode 2 generates photo carriers by photoelectrically converting the light entering from outside in its inside. On the transfer channel 3, a transfer gate electrode 5 is formed on the N type semiconductor substrate 1 through a gate dielectric film 4. When a specific voltage pulse is applied to the transfer gate electrode 5, the photo carries in the photodiode 2 are transferred to the transfer channel 3. An interlayer file 6 is formed so as to cover the transfer gate electrode 5. A first light-shield film 7 formed in a specific region on the interlayer film 6 is formed so as to shield the light from entering into the transfer channel 3. As a result, the smear noise characteristic of the solid-state image pickup device is improved, as reported in the Japanese Laid-open Patent Hei. 2-156670.

In the portion contacting with the N type semiconductor substrate 1, a contact hole 9 is formed by removing the gate dielectric film 4, interlayer film 6 and interlayer dielectric film 8. In the bottom of the contact hole 9, a diffusion layer 10 formed on the N type semiconductor substrate 1 is exposed. Through this contact hole 9, a wiring layer 11 is connected to the diffusion layer 10. The diffusion layer 10 is formed in order to connect the N type semiconductor substrate 1 and the wiring layer 11 well electrically. A second light-shield film 12 is formed on the first light-shield film 7 through the interlayer dielectric layer 8. Thus, the smear noise of the solid-state image pickup device may be reduced.

Furthermore, a final protective film 13 is provided in order to protect the uppermost surface of the solid-state image pickup device.

Referring next to FIG. 10, a conventional method for manufacturing a solid-state image pickup device is described below.

In FIG. 10 (a), an N type silicon substrate is used as the N type semiconductor substrate 1. In the N type semiconductor substrate 1, a photodiode 2 and a transfer channel 3 are formed by ion implantation and thermal diffusion. Afterwards, on the N type semiconductor substrate 1, a gate dielectric film 4, a transfer gate electrode 5, an interlayer film, 6, a first light-shield film 7, and a second interlayer dielectric film 8 are formed sequentially (FIG. 10 (b)).

Consequently, in nitrogen ($N_2$) atmosphere, flattening heat treatment is conducted at 900° C. or higher. As a result of the heat treatment, the interlayer dielectric film 8 is flattened. Hence, in the convex part of the matrix, the film thickness of the interlayer dielectric film 8 decreases. For example, in the shoulder part A of the step where the first light-shield film 7 is formed, the film thickness of the interlayer dielectric film 8 is extremely thin (FIG. 10 (c)).

Next, a contact hole 9 is opened by plasma etching. Then, in the gas containing phosphorus in the composition, for example, in the atmosphere of phosphine ($PH_3$) or the like, heat treatment is conducted at 900° C. or higher, and a phosphorus glass film ($P_2O_5$ film) (not shown) is formed on the entire surface. At the same time, from this phosphorus glass film, phosphorus is diffused thermally into the N type semiconductor substrate 1. In this way, the N type diffusion layer is formed as a diffusion layer 10.

Subsequently, using a chemical solution of water and hydrofluoric acid mixed at a rate of 20:1, the phosphorus glass film is removed by wet etching. In this wet etching, the chemical solution is hardly circulated in the bottom of the fine contact hole. Hence, sufficiently overetching is done so that the phosphorus glass film may not be left over. when using the chemical solution, empirically, the etching time of about 20 seconds is required. In the region where the circulation of chemical solution is promoted smoothly, the phosphorus glass film is removed promptly, so that the interlayer dielectric film 8 is also etched (FIG. 10 (d)).

Next, by sputtering method, an aluminum film is deposited on the entire substrate surface in a film thickness of 1 $\mu$m. Then, using the resist pattern (not shown) as the mask, plasma etching is effected to form a wiring layer 11 and a second light-shield film 12. Lastly, on the uppermost surface of the device, a silicon oxide film ($SiO_2$ film) is formed by plasma enhanced CVD method as a final protective film 13.

In such prior art, however, if the interlayer dielectric film 8 is formed thickly, the aspect ratio of the contact hole 9 formed therein becomes larger. Hence, it is difficult to etch adequately. Besides, because of the large aspect ratio, a step is formed in the wiring layer 11 on the contact hole 9. The same phenomenon occurs not only in the solid-state image pickup device, but also in other semiconductor devices.

As an intrinsic problem of the solid-state image pickup device, moreover, if the interlayer dielectric film 8 is formed thickly, the light enters the first light-shield film 7 from an oblique direction of the interlayer dielectric film 8. Since the first light-shield film 7 is formed in a proper thickness in consideration of the processability, part of the light penetrates through the first light-shield film 7, thereby deteriorating the smear noise characteristic of the CCD solid state image pickup device.

However, when it is attempted to apply the structure of the conventional semiconductor device and its manufacturing method in the solid-state image pickup device, in order to obtain a sufficient breakdown voltage of the interlayer dielectric film 8, the interlayer dielectric film 8 must be formed thickly beforehand, in consideration of the decrease of film thickness in the convex part of the matrix caused by flattening process.

Yet, generally, wet etching is large in the fluctuations of etching rate, and hence a large variance occurs in the decreasing the film thickness of the interlayer dielectric film 8 by overetching at the time of removal of the phosphorus glass film. Empirically, the film thickness of the interlayer dielectric film 8 varies in a range of about 20 to 40 nm in the wafer, between wafers, and between lots. Due to such fluctuations of the film thickness and necessity for obtaining specific interlayer dielectric breakdown voltage, it is more and more difficult to form the interlayer dielectric film 8 thinly.

The invention relates to the semiconductor device solving such problems of difficulty in thinning of the interlayer dielectric film.

SUMMARY OF THE INVENTION

To solve the above problems of difficulty in thinning of the interlayer dielectric film, the invention presents an interlayer dielectric film comprising a semiconductor substrate, a first conductive layer formed on the semiconductor substrate or the semiconductor substrate, and a second conductive layer formed on the first conductive layer at least through an interlayer dielectric film, wherein the interlayer dielectric film is composed of multiple-layer film of at least first interlayer dielectric film and second interlayer dielectric film, the second interlayer dielectric film is smaller in the etching ratio than the first interlayer dielectric film in etching of the interlayer dielectric films, and the second interlayer dielectric film is formed beneath the first interlayer dielectric film.

To solve the problems, the invention presents a semiconductor device comprising a semiconductor substrate, a separating region formed in the semiconductor substrate, an active region electrically separated by the separating region, one or more diffusion layers formed in the active region, a gate electrode formed on the active region through a gate dielectric film, a step formed at least by the gate electrode and separating region and the gate dielectric film excluding the region of the gate electrode, and an interlayer dielectric film formed on the step, wherein the interlayer dielectric film is composed of multiple-layer film of at least first interlayer dielectric film and second interlayer dielectric film, the second dielectric film is smaller in the etching ratio than the first interlayer dielectric film in etching of the interlayer dielectric films, the second interlayer dielectric film is formed beneath the first interlayer dielectric film, the first interlayer dielectric film is made of a flattened material, a contact hole is formed in the interlayer dielectric film, a wiring layer is formed on the first interlayer dielectric film, and this wiring layer is connected to the diffusion layer through the contact hole.

To solve the problems, the invention presents a solid-state image pickup device comprising a semiconductor substrate, a photodiode formed on the semiconductor substrate, a transfer channel formed on the semiconductor substrate at a specific gap to the photodiode, a transfer gate electrode formed on the semiconductor substrate through a gate dielectric film, an interlayer film formed on the transfer gate electrode, a first light-shield film formed on the interlayer film for shielding the transfer channel from lights and a second light-shield film formed on the first light-shield film at least through an interlayer dielectric film, wherein the interlayer dielectric film is composed of multiple-layer film of at least first interlayer dielectric film and second interlayer dielectric film, the second interlayer dielectric film is smaller in the etching ratio than the first interlayer dielectric film in etching of the interlayer dielectric films, and the second interlayer dielectric film is formed beneath the first interlayer dielectric film.

To solve the problems, the intention presents a method of manufacturing a solid-state image pickup device comprising a step of forming a photodiode on a semiconductor substrate, a step of forming a transfer channel on the semiconductor substrate at a specific gap to the photodiode, a step of forming a gate dielectric film on the semiconductor substrate, a step of forming an interlayer film on the transfer gate electrode, a step of forming a first light-shield film on the interlayer film for shielding the transfer channel from light, a step of forming a multiple-layer interlayer dielectric film composed of at least first interlayer dielectric film and second interlayer dielectric film on the first light-shield film in this sequence, a step of flattening the first interlayer dielectric film, a step of forming a second light-shield on the interlayer dielectric film, and a step of removing the second light-shield film by etching.

According to the structure of semiconductor device and its manufacturing method of the invention, if the first interlayer dielectric film is eliminated by specified etching and the specified etching influences up to the second interlayer dielectric film, the film thickness of the second interlayer dielectric film is hardly decreased, and therefore the second interlayer dielectric film is formed in a film thickness having a specific dielectric breakdown voltage, so that the film thickness in consideration of the interlayer dielectric breakdown voltage is not required in the first interlayer dielectric film. Hence, a sufficient thin film achieving a desired flat shape may be formed. Hence, the smear noise characteristic may be notably improved in the solid-state image pickup device employing the invention.

DESCRIPTION OF THE PREFERRED EMBODIMENTS

Figure 1:
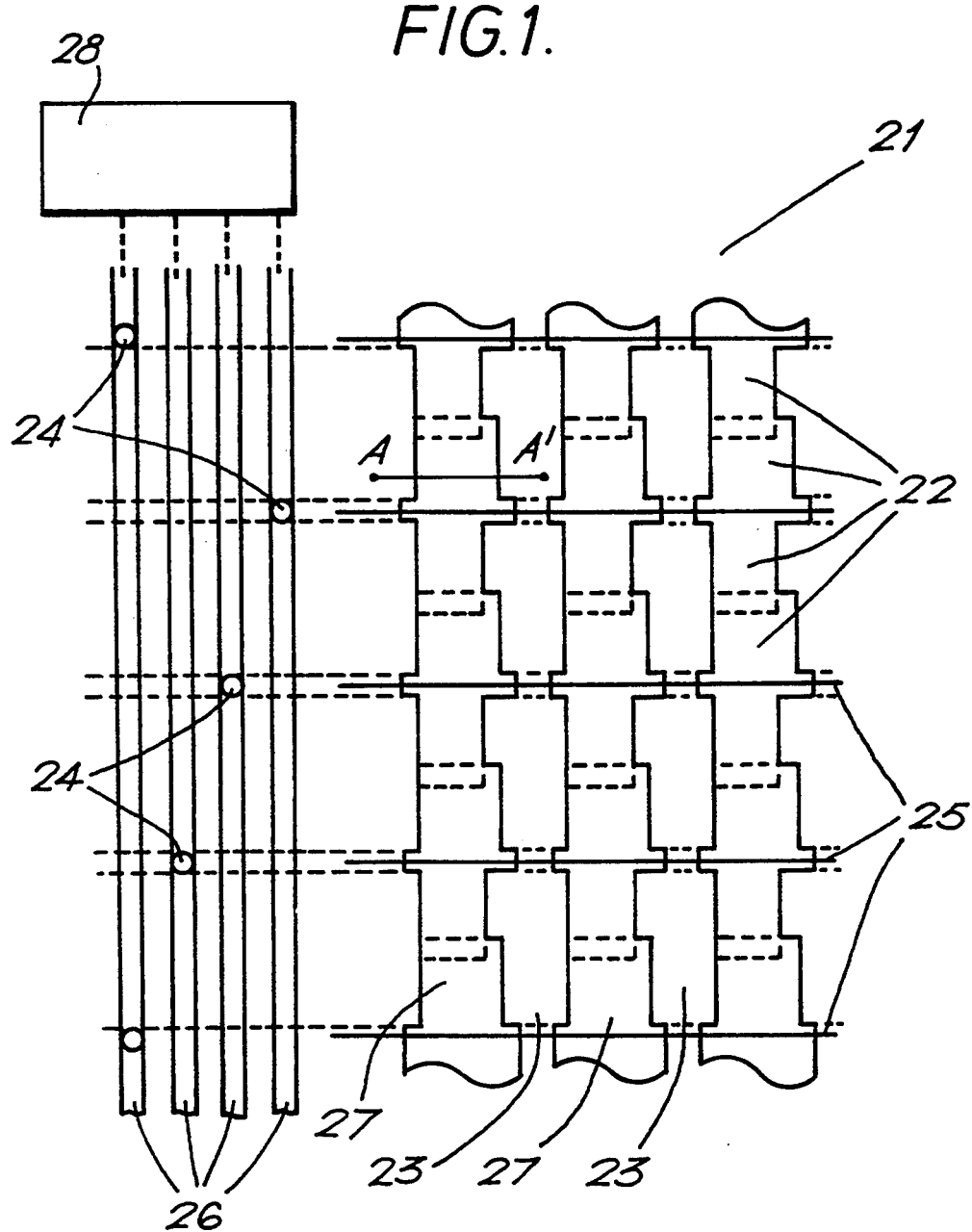
FIG. 1 is a plan view of an embodiment of a solid-state image pickup device of the invention.
Figure 2:
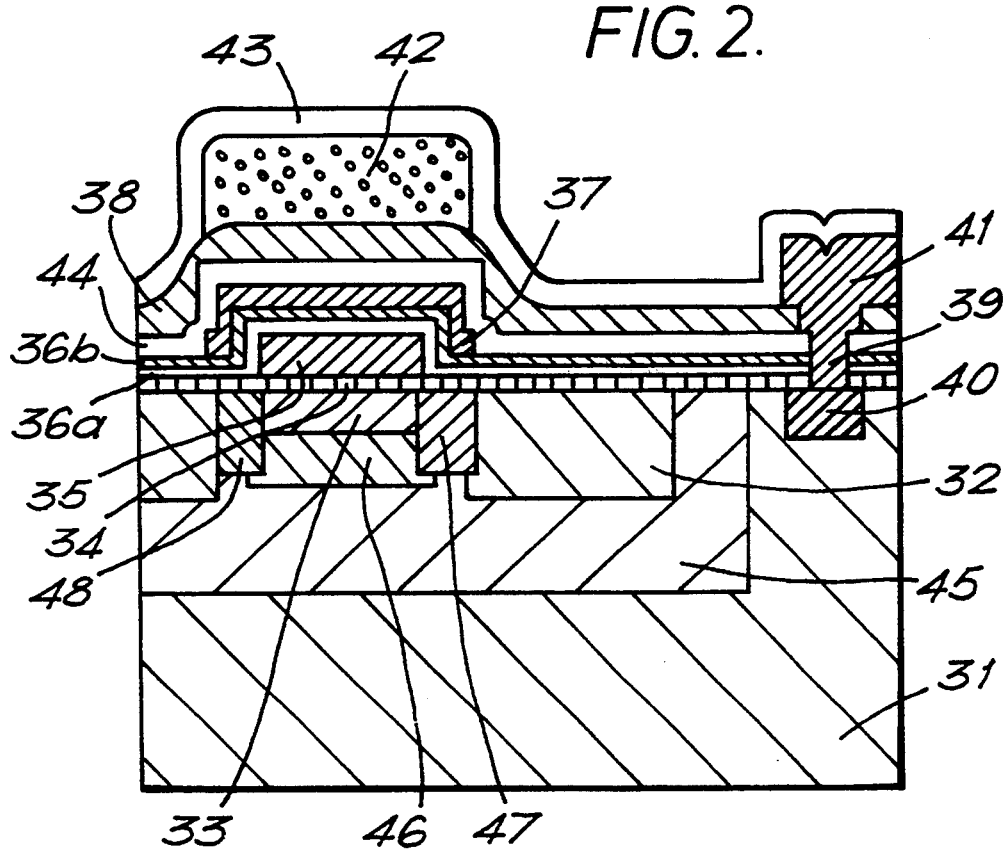
FIG. 2 is a sectional view of an embodiment of a solid-state image pickup device of the invention.

Referring now to the drawings, an example of solid-state image pickup device is described below as an embodiment of the invention. FIG. 1 is a plan structural diagram explaining the invention. In FIG. 1, the construction of the solid-state image pickup device is explained in the basic constituent parts. FIG. 2 is a sectional structural diagram in line A—A' in FIG. 1.

A transfer gate electrode 22 is formed on an N type semiconductor substrate 21. The transfer gate electrode 22 comprises a pair a first transfer gate electrode and second transfer gate electrode. This pair of transfer gate electrodes 22 is disposed linearly in the vertical direction of the sheet of paper on both sides of an interlayer dielectric film 25. Adjacently to the transfer gate electrode 22, a photodiode 23 is formed. That is, in the lateral direction on the sheet of paper, the transfer gate electrode 22 and the photodiode 23 make up a pair, and this pair is disposed linearly in the lateral direction. In this way, the transfer gate electrodes 22 and photodiodes 23 are formed in a matrix on the N type semiconductor substrate 21. One pitch in the image pickup region corresponds to a unit of the photodiode 23 and its adjacent transfer gate electrode 22. Thus, the size of the unit cell which is one pitch in the image pickup region is about 6 $\mu$m × about 6 $\mu$m.

The solid-state image pickup device in FIG. 1 is put in operation when a four-phase pulse is applied to the transfer gate electrodes. A transfer gate electrode group formed as the transfer gate electrodes 22 are electrically connected to the transfer gate electrodes adjacent in the lateral direction.

On the surface of the transfer gate electrode 22, an interlayer film (not shown) is formed, and the transfer gate electrode 22 is electrically insulated from a light shield film 27 and a wiring layer 28. A contact hole 24 is formed by etching and removing the interlayer film at the left end on the sheet of paper of the transfer gate electrode group. The dimension of the contact hole 24 in the vertical direction on the sheet of paper is about 1 $\mu$m.

The transfer gate electrode 22 is connected with the wiring layer 26 through the contact hold 24. Corresponding to the four-phase driving pulse for operating the solid-state image pickup device, four wiring layers 26 are provided. The transfer gate electrode group consists of a set of four transfer gate electrodes 22 composed of two transfer gate electrodes 22 overlapping in the vertical direction on the sheet of paper, and two transfer gate electrodes 22 formed on both sides of the interlayer dielectric film 25.

Driving pulses of different phases are applied from the wiring layer 26. The driving pulses are supplied to the transfer gate electrode group through the wiring layer 26 from a pulse driving circuit 28. The driving pulses generates three signal potentials of high (H), medium (M), and low (L). In this embodiment, they are respectively 15 V, 0 V, and 7 V. Although not shown in the drawings, similar contract hole, wiring layer, and driving circuit are disposed also at the right end of the transfer gate electrode group, and the same driving pulses as supplied from the driving circuit 28 are supplied. In this way, by feeding driving pulses from both sides of the transfer gate electrode group, a waveform of driving pulses is prevented from deforming as the driving pulse propagates through the gate electrodes 22, thereby avoiding deterioration of the transfer efficiency.

A light-shield film 27 is formed on the transfer gate electrode 22 through a dielectric film. The light-shield film 27 prevent the light from entering from outside into the transfer channel (not shown) which is an N type diffusion layer formed in the N type semiconductor substrate 21 beneath the transfer gate electrode 22. In the vertical direction on the sheet of paper, the transfer gate electrode 22 adjacent in the vertical direction to the transfer gate electrode 22 is overlapped because another transfer gate electrode. 22 is formed on one transfer gate electrode 22 by self-alignment in the manufacture of the transfer gate electrodes 22. The shape of the transfer gate electrode 22 is formed in a wider area in the upper transfer gate electrode 22 than that of the lower one, from the symmetrical line of the dielectric film 25. This is because the electric charge generated in the photodiode 23 is read out into the transfer channel formed in the N type semiconductor substrate 21 beneath the transfer gate 22 by the transfer gate electrode 22 formed above the dielectric film 25.

Hence, in order to pick up the electric charge generated in the photodiode 23 more easily, the transfer gate electrode 22 responsible for picking up is placed closer to the photodiode 23. Due to this reason, the area of the transfer gate electrode 22 differs on the opposites sides of the dielectric film 26.

In thus composed solid-state image pickup device, by applying 15 V to the upper transfer gate electrode 22 having a wider area, the signal charge can be read out from the photodiode 23 to the transfer channel. Consequently, by applying four-phase driving pulses alternately repeating 0 V and −7 V to the transfer gate electrodes 22, the signal charges read out in the transfer channels can be sequentially transferred to the specified output position.

In FIG. 2, the embodiment of the solid-state image pickup device applying the invention is explained in detail below.

First of all, the N type semiconductor substrate 31 has a plane azimuth of (100), and its impurity concentration is about $10^{14}$ cm$^{-3}$. On the N type semiconductor substrate 31, a first P type diffusion layer 45 is formed. The depth of the first P type diffusion layer 45 is about 5 $\mu$m. The impurity concentration of the first P type diffusion layer 45 is about $10^{15}$ cm$^{-3}$. The first P type diffusion layer 45 is provided in order to discharge overflown charge in the photodiode 32. That is, the photodiode 32 is formed as an N type diffusion layer on an N type semiconductor substrate 31. In the photodiode 32, by the light entering from outside, an electrode charge (photo carrier) is formed, and it is temporarily stored inside. If the charge is accumulated more than stored in the photodiode 32, it flows into other region from the photodiode 32. When such electric charge enters a transfer channel 33 formed in the N type diffusion layer, it may cause blooming. The occurrence of blooming may be prevented by forming a first P type diffusion layer 45. The first P type diffusion layer 45 is fixed at zero volt. Hence, in the potential distribution in these regions, the electric charge generated in the photodiode 32 is discharged into the N type semiconductor substrate 31 through the first P type diffusion layer 45. By setting the impurity concentration of the first P type diffusion layer 45 at the specified value, the photodiode 32 may be easily depleted when the solid-state image pickup device operates, and the quantity of the signal charge may increase. The depth of the first P type diffusion layer 45 is determined by the depth of the photodiode 32 and the breakdown voltage between the two. The depth of the photodiode 32 is required to be about 2 $\mu$m in order to obtain a sufficient photoelectric conversion efficiency when light in visible light region enters.

In the first P type diffusion layer 45, an N type diffusion layer is formed as a photodiode 32. When light enters the photodiode 32, an electron pair of electron and hole is generated in the depletion layer of the photodiode 32. The electron turns out to be a signal charge through the adjacent transfer channel 33. The hole is taken out of the N type semiconductor substrate 31 through the first P type diffusion layer 45. In this way, the photodiode 32 converts the incident light into the signal charge. The impurity concentration of the photodiode 32 is about $10^{16}$ cm$^{-3}$. Inside the first P type diffusion layer 45, a second P type diffusion layer 46 is formed. The second P type diffusion layer 46 prevents the electric charge as a noise, out of the signals generated in the N type semiconductor substrate 31 from diffusing into the transfer channel 33. The diffusion depth of the second P type diffusion layer 46 is about 1 μm. The impurity concentration of the second P type diffusion layer 46 is $10^{16}$ cm$^{-3}$.

The second P type diffusion layer 46 is used for enclosing the transfer channel 33 composed of N type diffusion layer. Generally, such structure is called the Hi-C structure. When the diffusion depth of the second diffusion layer 46 is increased by heat treatment, diffusion in the lateral direction is promoted at the same time. Hence, the second P type diffusion layer 46 invades up to the N type diffusion layer of the photodiode 32. When the second diffusion layer 46 invades into the photodiode 32, the photoelectric conversion output is lowered. The transfer channel 33 transfers the signal charge formed in the photodiode 32 into a specific region.

Herein, the diffusion depth of the transfer channel 33 is about 0.5 μm. The impurity concentration of the transfer channel 33 is $10^{16}$ to $10^{17}$ cm$^{-3}$.

To realize the Hi-C structure, the second P type diffusion layer 46 must be set wider than the transfer channel 33.

When reading out the signal charge generated in the photodiode 32 into the transfer channel 33, the potential of the transfer channel 33 is set lower than the potential of the photodiode 32. When the signal charge conveyed to the transfer channel 33 flows back to the photodiode 32 or the signal charge is present in the transfer channel 33, the signal charge formed in the photodiode 32 must be prevented from flowing into the transfer channel 33. Accordingly, a third P type diffusion layer 47 for controlling the potential at the time of reading out is formed between the photodiode 32 and the transfer channel 33. If a signal charge is transferred from the photodiode 32 to the transfer channel 33, the potential in the third P-type diffusion layer 47 is controlled to be lower than the potential of the photodiode 32, and same as or slightly higher than the potential of the transfer channel 33. When the signal charge is accumulated in the transfer channel 33, in order that the signal charge may not flow back into the photodiode 32, the potential of the third P type diffusion layer 47 is controlled to be higher than the potential of the photodiode 32, and higher than the potential of the transfer channel 33.

The diffusion layer depth of the third P type diffusion layer 47 is about 1 μm. The surface concentration of the third P type diffusion layer 47 on the semiconductor substrate surface is $10^{16}$ to $10^{17}$ cm$^{-3}$.

When the voltage of the driving pulse for operating the solid-state image pickup device is zero volt or 15 V, it is necessary to prevent the signal charge from flowing back from the transfer channel 33 into the photodiode 32, or to cause the signal charge to flow in from the photodiode 32 into the transfer channel 33. In order to achieve the threshold voltage capable of maintaining an optimum potential distribution in each state, the diffusion layer depth of the third P type diffusion layer 47 and the impurity concentration are defined. The width of the third P type diffusion layer 47 should be preferably about 1 μm or less. If the width of the third P type diffusion layer 47 is more than 1 μm, the gm characteristic of the transistor is impaired. As the gm characteristic becomes inferior, it is impossible to read out the signal charge accumulated in the photodiode 32 completely. To the contrary, if the width of the third P type diffusion layer 47 is less than about 1 μm, a short channel effect takes place. By the short channel effect, punch-through is likely to occur, as a result, the photoelectric conversion output of the photodiode 32 becomes smaller.

In the solid-state image pickup device, photodiodes 32 and transfer channels 33 compose pairs, and are formed in a matrix. To separate a pair and an adjacent pair electrically, a fourth P type diffusion layer 48 is formed. The fourth P type diffusion layer 48 is formed by ion implantation. The depth of the fourth P type diffusion layer 48 is about 1 μm. The surface concentration of the fourth P type diffusion layer 48 is $10^{17}$ to $10^{18}$ cm$^{-3}$.

The surface concentration of the fourth P type diffusion layer 48 must be set in the above range in order that the signal charge accumulated in the adjacent photodiode 32 may not flow in. If the surface concentration is smaller than $10^7$ cm$^{-3}$, the signal charge of the adjacent photodiode 32 flows in. If the surface concentration is more than $10^{18}$ cm$^{-3}$, a narrow channel effect occurs in the adjacent transfer channel 33. As a result of the narrow channel effect, the transfer capacity of the transfer channel 33 is lowered. Hence, the dynamic range of the solid-state image pickup device becomes small, and the transfer efficiency is impaired.

The width of the fourth P type diffusion layer 48 should be about 1 μm or less. If the width of the fourth P type diffusion layer 48 is larger than 1 μm, the transfer region of the transfer channel 33 decreases. That is, the signal charge accumulated in the photodiode 32 cannot be read out completely. To the contrary, if the width of the fourth P type diffusion layer 48 is smaller than 1 μm, a short channel effect occurs. By the short channel effect, punch-through is likely to occur between the adjacent photo diode 32 and transfer channel 33. As a result, reading out the information in the adjacent photodiode 32, the resolution is lowered. Furthermore, the output of the photodiode 32 is lowered.

On the N type semiconductor substrate 31, a gate dielectric film 34 is grown by silicon oxide film. The gate dielectric film 34 is formed by pyrogenic oxidation method. The film thickness of the gate dielectric film 34 is preferably 50 nm or more in order to raise the transfer efficiency by utilizing the fringing effect.

The transfer gate electrode 35 is formed by pattering the polysilicon grown by the low pressure CVD method. The sheet resistance of the transfer gate electrode 35 is scores of ohms. The film thickness of the transfer gate electrode 35 is about 500 nm. The transfer gate electrode 35 is used as an electrode for applying a driving pulse for transfer, by reading out the signal charge formed by the photodiode 32 into the transfer channel 33. Thus, the transfer gate electrode 35 is desired to be as low in resistance as possible. However, if the phosphorus dope is increased for the purpose of lowering the resistance, the surface of the transfer gate electrode 35 is oxidized, and the breakdown voltage of the formed interlayer film 36a is deteriorated, and hence the phosphorus dope should be preferably in the amount specified above. On the surface of the transfer gate electrode 35, an interlayer film 36a composed of polysilicon oxide film is grown.

The interlayer film 36a is grown by oxidizing the surface of the transfer gate electrode 35 by pyrogenic oxidation process. The film thickness of the interlayer film 36a is about 200 nm. The interlayer film 36a is formed so as to maintain a breakdown voltage. Due to the etching residue of the polysilicon film caused by etching at the time of forming the transfer gate electrode 35, when a driving voltage is applied, leak occurs through the etching residue on the polysilicon film. By burning out the etching residue of polysilicon when forming the interlayer film 36a, leak may be prevented. Since the four-phase driving pulses applied to the transfer gate electrode 35 change in the level such as −7 V, 0 V, and +15 V, the interlayer film 36b has the breakdown voltage of more than the maximum differential voltage of 22 V.

On the surface of the interlayer film 36a, the interlayer film 36b is formed by polysilicon oxide film. The film thickness of the interlayer film 36b is about 100 nm. The interlayer film 36b is formed by CVD method. The interlayer film 36b is formed in order to prevent local lowering of the breakdown voltage due to pin hole or the like in the interlayer film 36a. To decrease the etching residue in etching of the first light-shield film 37, it is necessary to improve the step coverage in the interlayer film 36a. As the growing method of the interlayer film 36b, the low pressure CVD method is more appropriate than the atmosphere pressure CVD method. The thicker the interlayer film 36b, the more increases the gap between the first light-shield film 37 and N type semiconductor substrate 31, and the light entering the transfer channel 33 from the oblique direction increases, thereby increasing the smear noise. It is not preferable if the interlayer film 36b exceeds the specified thickness too much.

In order to prevent the light from entering the transfer channel 33 to be smear noise, the first lights-shield film 37 is formed. In the invention, as the first light-shield film 37, a tungsten polycide film by stacking up a polysilicon film and tungsten silicide film was used. The polysilicon film forming the lower layer of the first light-shield film 37 (hereinafter called the lower polysilicon film) is grown by the low pressure CVD method. The film thickness of the lower polysilicon film is about 100 nm. This film thickness is determined to relieve the stress between the interlayer film 36b of the base and the tungsten silicide film forming the upper layer of the first light-shield film 37 (hereinafter called the upper tungsten silicide film), and prevent the upper silicide film from peeling off. From the optical transmission characteristic of the tungsten silicide film, for reduction of smear noise (enhancement of light-shield characteristic of the tungsten silicide film), it is necessary to increase the thickness of the tungsten silicide film, but considering the processability of the tungsten silicide film in the subsequent steps and prevention of peeling of the film, the film thickness is defined at 200 nm. At the film thickness of 200 mm, the transmissivity of visible light is about 0.01%, and this film thickness is free from problem for use as a light-shield film. The upper tungsten silicide film may be formed by sputtering method, but preferably in order that the film thickness may not be decreased in the step portion of the transfer gate electrode 35 to deteriorate in the light-shield characteristic, it is better to form by the CVD method which is excellent in the coverage. The photo carrier caused by the light entering the transfer channel 33 becomes smear noise component. The first light-shield film 37 is formed in order to prevent incidence of light into the transfer channel 33 to avoid generation of smear noise. The first light-shield film 37 is formed on the interlayer film 36b, and is formed in a shape covering the transfer gate electrode 35b and a shape forming an opening region above the photodiode 32. The relation of the position between the end of the first light-shield film 37 and the end of the photodiode 32 is in the trade-off relation of the smear noise characteristic for the sensitivity of the solid-state image pickup device. When the end portion of the first light-shield film 37 projects onto the photodiode 32, the incident light onto the photodiode 32 decreases, and hence the sensitivity drops, whereas the light incidence into the transfer channel 33 decreases, thereby decreasing the smear noise. If the end of the first light-shield film 37 does not reach the vicinity of the end of the photodiode 32, the smear noise characteristic deteriorates without improvement of the sensitivity. As shown in FIG. 2, the end portion of the first light-shield film 37 should, preferably, at least reach the vicinity of the end of the photodiode 32.

On the first light-shield film 37, and on the interlayer film 36b in the opening region of the first light-shield film 37, a second interlayer dielectric film 44 composed of a silicone oxide film is provided. The second interlayer dielectric film 44 is grown by low pressure CVD method or atmosphere pressure CVD method. The thickness of the second interlayer dielectric film 44 is 200 nm. This film thickness is determined so as to achieve the following two purposes even by the second interlayer dielectric film 44 alone. The first purpose is to form a buffer layer which prevents the etching damage by the dry etching for patterning the second light-shield film 42 from causing crystal defect in the photodiode 32. In the embodiment, since a silicone-containing aluminum film is used as the second light-shield film, heat treatment at about 900° C. for recovering from such etching damage cannot be generally performed. Such crystal defect in the photodiode 32 induces a serious problem appearing on the image screen as a white blemish. The second purpose is to keep a specific dielectric breakdown voltage between the transfer gate electrode 35 and the wiring layer including the first light-shield film 37, second light-shield film 42 and wiring layer 41. In the case of the solid-state image pickup device of the embodiment, the second interlayer dielectric film 44 requires a breakdown voltage of about 30 V. On the other hand, to achieve these two purposes, the thickness of the second interlayer dielectric film 44 may be increased, but this solving means is not recommended in the following points. That is, the light entering the first light-shield film 37 from oblique direction through the second interlayer dielectric film 44 increases. When the intensity of this oblique incident light is strong, a part of light passes through the first light-shield film 37 to cause smear noise. The smear noise characteristic is particularly important among characteristics of the solid-state image pickup device, and hence it is necessary to keep at lowest possible level, and it is not appropriate to increase the thickness of the second interlayer film 44.

On the second interlayer dielectric film 44, a first interlayer dielectric film 38 of boron phosphosilicate glass (BPSG) film is formed. The first interlayer dielectric film 38 is stacked up by the atmosphere pressure CVD method. The first interlayer dielectric film 38 is grown in thickness of 600 nm, and this film thickness is the figure in a flat region. Due to the poorness of the step coverage in the atmosphere pressure CVD method, the film thickness is thinner in the region where the uppermost surface is in a concave form. For example, on the second interlayer dielectric film 44 above the photodiode 32, the growth is only about 400 nm in the thinnest portion. The fist interlayer dielectric film 38 is flattened on the uppermost surface by heat treatment at 900° C. in $N_2$ atmosphere. The BPSG film composing the first interlayer dielectric film 38 contains boron and phosphorus-by about 3 wt. %, and about 6 wt. %, respectively, when stacking up. The higher the concentrations of boron and phosphorus in the BPSG film, the greater is the flattening effect on the uppermost surface by flattening heat treatment, but boron and phosphorus may diffuse externally from the film during the flattening heat treatment, and react in the vapor phase to produce granular foreign matter on the BPSG film surface. Therefore, the boron and phosphorus concentrations in the first interlayer dielectric film 38 should be preferably controlled below the specified values. On the other hand, the boron and phosphorus concentrations maybe lowered than specified, but in this case, the uppermost surface of the first interlayer dielectric film 38 deteriorates for the flattened shape. The concentrations of boron and phosphorus may be lowered in the range satisfying the following flattening requirements. The flattened shape particularly depends on the boron concentrations, and the lower limit is about 1.2 wt. % in this embodiment. The flattened shape may be improved by increasing the thickness of the first interlayer dielectric film 38, but same as in the case of the second interlayer dielectric film 44, it is not desired to increase the film thickness from the viewpoint of smear noise characteristic.

Flattening of the uppermost surface of the first interlayer dielectric film 38 is intended to form the second light-shield film 42 in satisfactory covering property without cracks, and shorten the overetching in the dry etching step for patterning the second light-shield film 42 and wiring layer 41. The worse the flatness of the uppermost surface of the first interlayer dielectric film 38, the longer is required the extension of overetching at the time of etching of the wiring layer 41 and second light-shield film 42. It causes to increase the white blemish by more etching damage to the photodiode 32. In the structure of the solid-state image pickup device of the embodiment, the maximum gradient of the uppermost surface of the first interlayer dielectric film 38 is about 70 degrees, and the overetching time for the proper etching time in the flat region of the solid state image pickup device may be enough at about 60% in the same etching conditions, and etching without etching residue and generation of white blemish may be achieved. The greater the gradient, the longer is required the extension of the overetching time, which is likely to cause white blemish. The shape of the uppermost surface of the first interlayer dielectric film 38 should not be overhang shape.

The first interlayer dielectric film 38 is stacked up in a film thickness of 60 nm, but it is thinner than this film thickness in the step portion of the base ground due to viscous fluidity at the time of flattening treatment. For example, in the shoulder part of the first light-shield film 37 after flattening heat treatment, the film thickness of the first interlayer dielectric film 38 is about 300 nm.

In the sectional view of the solid-state image pickup device shown in. FIG. 2, in the shoulder part of the first light-shield film 37, the first interlayer dielectric film 33 is eliminated, and the second light-shield film 42 and the second interlayer dielectric film 44 contact with each other. This is owing to the following reason. In the manufacturing process of the solid-state image pickup device, by specified etching on the uppermost surface of the first interlayer dielectric film 38, film thickness decreases. The relation between this specified etching and film thickness reduction of the first interlayer dielectric film 38 is described in detail later.

A second light-shield film 42 is formed on the first interlayer dielectric film 38 above the first light-shield film 37. The second light-shield film 42 is composed of aluminum film containing 1% of silicon. The use of silicon-containing aluminum film as the second light-shield film 42 is to form in the same film forming step and etching step of the wiring layer 41 in order to simplify the process. When the second light-shield film 42 is formed in different film forming step and etching step of the wiring layer 41, for example, pure aluminum may be used. In this case, the problem of increase of light transmissivity due to silicon modules noted when heat treatment is applied to the silicon containing aluminum may be avoided. The film thickness of the silicone containing aluminum for forming the second light-shield film 42 is 1 μm. At this film thickness, the light transmissivity of the second light-shield film 42 is 0.01%, and a sufficient light-shield-characteristic is presented practically. Whereas the first light-shield film 37 is effective to prevent incidence of light from an oblique direction to the transfer channel 33, the second light-shield film 42 is provided mainly in order to prevent incidence of intense light from vertical direction into the transfer channel 33 through the first light-shield film 37. The second light-shield film 42 is provided at least in a shape of covering entirely above the transfer channel 33. The end portion of the second light-shield film 42 should preferably not project upward of the photodiode 32 beyond the end portion of the first light-shield film 37 so as not to lower the sensitivity of the photodiode 32.

The contact hole 39 is opened by etching and removing the gate dielectric film 34, interlayer film 36a, interlayer film 36b, second interlayer dielectric film 44 and first interlayer dielectric film 38. The contact hole 39 is present in the peripheral parts of the solids-state image pickup device, and the geometrical relation with the image pickup region of the solid-state image pickup device is not clearly defined. FIG. 2 shows it close to the image pickup region of the solid-state image pickup device for the sake of convenience. The size of the contact hole 39 is about 5 μm × about 5 μm. Although not shown in FIG. 2, as explained in FIG. 1, the minimum diameter of the contact holes provided for applying driving pulses to the transfer gate electrode 35 is about 1 μm, and they are opened by etching and removing the interlayer film 36a, interlayer film 36b, second interlayer dielectric film 44 and first interlayer dielectric film 38.

In the bottom of the contact hole 39, an N type diffusion layer 40 formed by thermally diffusing phosphorus is present. The N type diffusion layer 40 is formed by heat treatment after opening of the contact hole 39 in the phosphorus-containing atmosphere such as $POCl_3$, and $PII_3$. The N type diffusion layer 40 is formed in order to obtain an ohmic electric contact of the wiring layer 41 formed by silicon containing aluminum and the N type semiconductor substrate 31 without showing rectifying property. The sheet resistance of the N type diffusion layer 40 is about 5 to 10 Ω/□. The N type diffusion layer 41 has an expanse of about 2 μm in depth.

The wiring layer 41 is composed of aluminum containing silicon. The silicon content of the wiring layer 41 is about 1%. The film thickness of the wiring layer 41 is about 1 μm. The wiring layer 41 is connected to the N type semiconductor substrate 31 through the contact hole 39, and a voltage is applied. A voltage of about 10 V is applied to the N type semiconductor substrate 31, and the photo carrier generated in the photodiode 32 is led into the N type semiconductor substrate 31 side so as not escape into the transfer channel 33. At the time of vertical withdrawing action, a voltage of about 30 V is applied to the N type semiconductor substrate 31. The Vertical withdrawing action is to withdraw all photo carriers accumulated in the photodiode 32 by force into the N type semiconductor substrate 31 by applying a voltage of 30 V to the N type semiconductor substrate 31, which is, so to speak, the shutter action of the solid-state image pickup device.

On the uppermost surface of the solid-state image pickup device, a final protective film 43 is formed by the silicon oxide film grown by plasma enhanced CVD method. The thickness of the final protective film 43 is 400 nm. The final protective film 43 protects the uppermost surface of the solid-state state image pickup device and the solid-state image pickup device from, for example, invasion of movable ions from outside.

In thus composed solid-state image pickup device, the operation is described below. Light enters the photodiode 32 formed in the N type semiconductor substrate 31 from outside as a signal. In the photodiode 32, photoelectric conversion takes place, and the photo carriers depending on the quantity of light are generated and accumulated. In this state, when a pulse voltage of +15 V is applied to the transfer gate electrode 35, the photo carrier is read out into the transfer channel 33. Next, pulse voltages alternatively repeating voltages of 0 V and 7 V are applied to the transfer gate electrode 35, and the photo carriers inside the transfer channel 33 can be transferred up to the specified output unit. Specified voltages are applied to the first light-shield film 37 and second light-shield film 42.

A specified voltage from the wiring layer 41 is applied to the N type semiconductor substrate 31. Usually, a voltage of about 10 V is applied, and photo carriers overflowing from the photodiode 32 are led into the N type semiconductor substrate 31, thereby not flowing into the transfer channel 33. At the time of vertical withdrawing electronic shutter action, a voltage about 30 V is applied. This is intended to effect the shutter action of the solid-state image pickup device by withdrawing all of the photo carriers accumulated inside the photodiode 32 into the N type semiconductor substrate 31.

In the solid-state image pickup device in the embodiment of the invention, a specified interlayer dielectric film is composed of a stacked film of first interlayer dielectric film 38 and second interlayer dielectric film 44. In specified etching, it is characteristic to use a material of which etching rate of the second interlayer dielectric film 44 is sufficiently slower than that of the first interlayer dielectric film 38. In the solid-state image pickup device having such constitution of the interlayer dielectric film, after the specified etching, if the first interlayer dielectric film 38 is eliminated in the portion thinned by flattening treatment, and this specified etching further reaches up to the second interlayer dielectric film 44, the etching of the second interlayer dielectric film 55 is hardly progressed. Owing to such effect, a high quality and a stable yield are obtained in the solid-state image pickup device of the embodiment as described in detail hereinafter.

In the manufacturing process of the solid-state image pickup device, specified etching is executed on the uppermost surface of the first interlayer dielectric film 38 after flattening heat treatment. This specified etching is described below, which is executed before the second light-shield film 42 is formed. The N-type diffusion layer 40 is formed by solid phase diffusion of phosphorus from the phosphorus glass ($P_2O_5$) film (not shown) grown on the entire surface of the solid-state image pickup device. This phosphorus glass film is unnecessary after the N type diffusion film 41 is formed, and therefore it is removed by wet etching using a mixed solution of water ($H_2O$) and hydrofluoric acid. The mixing-ratio of water:hydrofluoric acid is 20:1. This mixing ratio is determined in consideration of the controllability of etching rate and the through-put. The thickness of the phosphorus glass film to be grown is about 50 nm or less, and it is difficult to accurately measure the etching rate in this chemical solution. For example, however, to completely remove this phosphorus glass film in a slow circulation region of chemical solution such as the contact hole of the transfer gate electrode 35 opened with a minimum diameter 1 μm (aspect ratio about 1) in the solid-state image pickup device, it is known that about 20 seconds be appropriate including the effects of fluctuations between lots and fluctuations by fatigue of the chemical solution. On the other hand, the etching rate of this chemical solution on the BPSG film for the first interlayer dielectric film 38 and the silicon oxide film for the second interlayer dielectric film 44 is respectfully 450 nm/min and 30 nm/min. It is, however, confirmed that diffusion of phosphorus from the phosphorus glass film occurs on the first interlayer dielectric film 38 from the phosphorus glass film from the surface to a depth of about 200 nm, and that the average etching rate in this region is increased to about 1000 nm/min.

The wet etching is generally batch processing for charging a plurality of semiconductor substrates contained in a specific cassette into a circulating chemical solution tank filled with a specified etching solution. This method is inexpensive to the apparatus, but the controllability is poor at the start point and end point of etching, and hence the chemical solution fatigues when etching process is repeated. Besides, the circulation of the chemical solution depends on the number of pieces and the arrangement of the semiconductor substrates charged in. It is also known that extremely many factors are known to fluctuate the etching rate. These factors cause significant fluctuations in the film thickness reduction when the etching time is short, in particular. In addition, the phosphorus diffusion layer extending from the surface of the first interlayer dielectric film 38 to the depth of 20 nm also causes to vary the film thickness reduction extent. The thickness reduction of the first interlayer dielectric film 38 by wet etching always occurs in a range of 200 to 400 nm if the fluctuations are controlled well. In particular, an individual difference occurs in the substantial etching time when charging and discharging in and out of the chemical solution are done manually by plural workers. Hence, the fluctuations of film thickness reduction are further expanded. In the swollen portion of the base material such as the shoulder of the first light-shield film 37, the thickness of the first interlayer dielectric film 38 is decreased to 300 nm by flattening heat treatment. If, therefore, the film reduction is biased to the larger side, it is etched and removed as shown in FIG. 2, and the second interlayer dielectric film 44 is exposed. Or, in the case of a dent shape of the base material, for example, above the photodiode 32, in the thinner thickness region of the first interlayer dielectric film 38 from the beginning of stacking. The second interlayer dielectric film 44 is also exposed. If etching reaches up to the exposed second interlayer dielectric film 44, its film thickness reduction is very small. That is, since the etching rate of the silicon oxide film for forming the second interlayer dielectric film 44 is 30 nm/min, the film reduction in the region exposed by etching is less than 10 nm. Thus, the second interlayer dielectric film 44 plays the roles of a stopper for etching. As mentioned above, with the second dielectric film 44 alone, it is effective to keep the interlayer dielectric breakdown voltage and play the role of etching damage buffer layer. Hence, it is no problem if the first interlayer dielectric film 38 is eliminated in the thin area.

On the other hand, from the swollen part of the step of the base material, a viscous fluid film flows in, and the film thickness increases in the first interlayer dielectric film 38. The first interlayer dielectric film 38 will not disappear if the fluctuations of the film thickness are within the above range. As a result, the flattened shape of the uppermost surface of the first interlayer dielectric film 38 is hardly deteriorated, and the overetching time is not extended at least in the occurrence of deterioration or crack of the step coverage shape of the second light-shield film 42, or etching of the second light shield film 42.

In the conventional solid-state image pickup device, the following problems were experienced. In the solid-state image pickup device, hitherto, the interlayer dielectric film intervening between the first light-shield film 37 and second light-shield film 42 is composed of BPSG film (hereinafter called interlayer BPSG film (hereinafter called interlayer BPSG film). To solve the problems of interlayer dielectric breakdown voltage and etching damage buffer, the thickness of the interlayer BPSG film is required to be at least 200 nm, and the stacking condition for obtaining this film thickness is the thickness of 900 nm. This film thickness is a figure estimated from that fact that the film thickness decreases in the base swollen part by flattening, and that the film reduction due to etching and removing of the phosphorus glass film is 400 nm at maximum in the case of favorable controllability. Actually, in production of products, the margin considering the variations due to individual difference of workers in the working procedure should be settled within the film thickness, and a further greater film thickness is needed seeing that the etching rate of the interlayer BPSG film is relatively fast at 450 nm/min. Considering also the film thickness fluctuations of stacking up on the interlayer BPSG film, the stacking film thickness must be more than 1100 nm.

Generally, however, when growing the BPSG film in the atmosphere pressure CVD method, the particles generated by vapor phase reaction increase with the increase of film thickness, thereby lowering the yield.

Meanwhile, the contact hole opened by etching and removing the interlayer BPSG film is proceed by reactive ion etching using fluorohydrocarbon gas such as $CHF_3$ as etching gas, but is empirically known that the abnormal deposition is likely to be formed in the etching region with the increase of thickness of the BPSG film. This abnormal deposition is a polymer grown mainly from carbon and fluorine, and it is a trouble often found in the BPSG film, in particular, but no other detail has been unveiled, but anyway it is one of the factors of lowering of the yield.

Besides, as mentioned above, if the thickness is increased in the interlayer dielectric film intervening between the first light-shield film 37 and second light-shield film 42, the smear noise characteristic of the solid-state image pickup device deteriorates. In the conventional constitution of the solid-state image pickup device, when produced by defining the film thickness upon growth of the interlayer BPSG film at a minimum limit of 900 nm, those obtained as conforming pieces regarding the interlayer dielectric breakdown voltage are formed in the same interlayer dielectric film of the first interlayer dielectric film 378 and second interlayer dielectric film 44 of the solid state image pickup device in the structure of the embodiment, and a similar smear noise value is obtained, but the yield has been lowered due to occurrence of failure of interlayer breakdown voltage and white blemish.

By contrast, in the solid-state image pickup device conforming to the invention, the first interlayer dielectric film 44 functions as etching stopper, and no problem is caused on the interlayer dielectric breakdown voltage or etching damage buffer. Therefore, it is not necessary to increase the thickness of the first interlayer dielectric film 38 in order to keep margin, and the polymer is not stacked up when etching the particle or contact hole at the time of film growth, and smear noise deterioration does not occur. It is hence possible to produce the solid-state image pickup device with high quality at a stable yield.

Referring now to FIGS. 3 to 7, the manufacturing method of the invention is described below.

Figure 3:
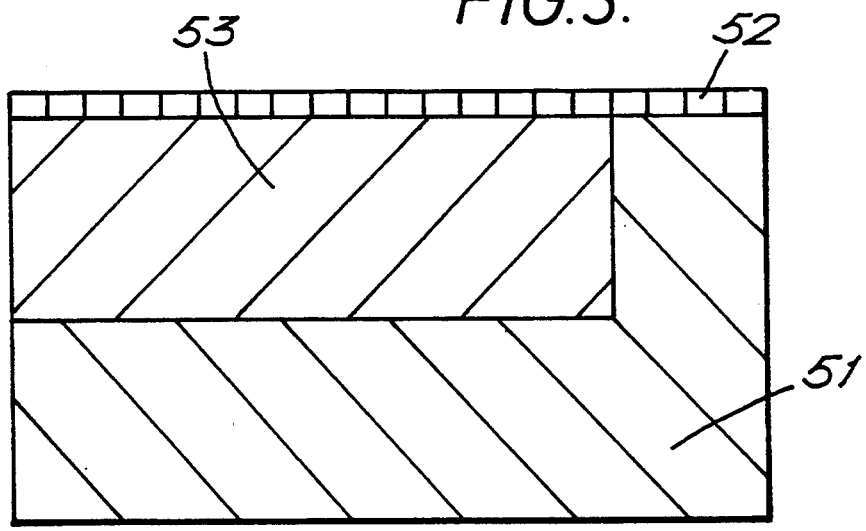
FIG. 3 is a process sectional diagram of an embodiment of manufacturing method of a solid-state image pickup device of the invention.

First, on the principal plane of an N type semiconductor substrate 51, a thermal oxide film 52 of about 100 nm in thickness is formed. A photoresist (not shown) is applied on the N type semiconductor substrate 51, and the region of a first P type diffusion layer 53 is exposed and developed, thereby forming a resist pattern. Using this resist pattern as the mask, boron ions are implanted. At this time, the ion implantation condition is the acceleration voltage of 100 keV and implantation dose of about $10^{12}$ cm$^{-2}$. Afterwards, in $N_2$ atmosphere, heat treatment is conducted for several hours at heat treatment temperature of 1100° C., and the boron ions are diffused to a depth of about 5 $\mu$m beneath the N type semiconductor substrate 51, thereby forming a first P type diffusion layer 53. At the same time, by this heat treatment, the ion-implanted boron is activated (FIG. 3).

Consequently, a photoresist (not shown) is applied on the N type semiconductor substrate 51, the region of a photodiode 54 is exposed and developed, thereby forming a resist pattern. Using this resist pattern as the mask, phosphorus ions are implanted. At this time, the ion implantation condition is the acceleration voltage of several hundred keV and implantation dose of about $10^{12}$ cm$^{-2}$. Later, in $N_2$ atmosphere, heat treatment is conducted at 1000° C. or higher. As a result, the implantation depth of the photodiode 54 is about 2 μm. Thus, the photodiode 54 is formed in the specified region of the first P type diffusion layer 53.

Removing the resist on the N type semiconductor substrate 51, a photo resist (not shown) is formed again on the N type semiconductor substrate 51. By exposing and developing the region of a second P type diffusion layer 55, a resist pattern is formed. Using this resist pattern as the mask, boron ions are implanted. At this time, the ion implantation condition is the acceleration voltage of about 100 keV and the implantation dose of $10^{12}$ cm$^{-2}$. As a result, the diffusion depth of the second P type diffusion layer 55 is finally about 1 μm. Thus is formed the second P type diffusion layer 55 on the first P type diffusion layer 53 which is a P type well, for preventing the electric charge which becomes noise generated in the N type semiconductor substrate 51 from diffusing into the transfer channel.

Furthermore, removing the resist pattern on the N type semiconductor substrate 51, a photoresist (no shown) is formed on the N type semiconductor substrate 51. By exposing and developing the transfer channel 56, a resist pattern is formed. Using this resist pattern as the mask, phosphorous ions are imparted. At this time, the ion implantation condition is the acceleration voltage of about 100 keV, and implantation dose of $10^{12}$ cm$^{-2}$. As a result, the diffusion depth of the transfer channel 56 is about 0.5 μm. Thus is formed the transfer channel 56.

Consequently, removing the photoresist from the N type semiconductor substrate 51, a photoresist (not shown) is formed again on the N type semiconductor substrate 51. By exposing and developing the region of a third P type diffusion region 57, a resist pattern is formed. Using the resist pattern as the mask, boron ions are implanted. At this time, the ion implantation condition is the acceleration voltage of scores of keV and implantation does of $10^{12}$ cm$^{-2}$. As a result, the implantation depth of the third P type diffusion layer 57 is about 1 μm. By implanting in such condition, the threshold voltage between the photodiode 54 and transfer channel 56 can be controlled. Thus is formed the third P type diffusion layer 57 for controlling the potential of reading out the photo carries from the photodiode 54 to the transfer channel 56, between the photodiode 54 and transfer channel 56.

Figure 4:
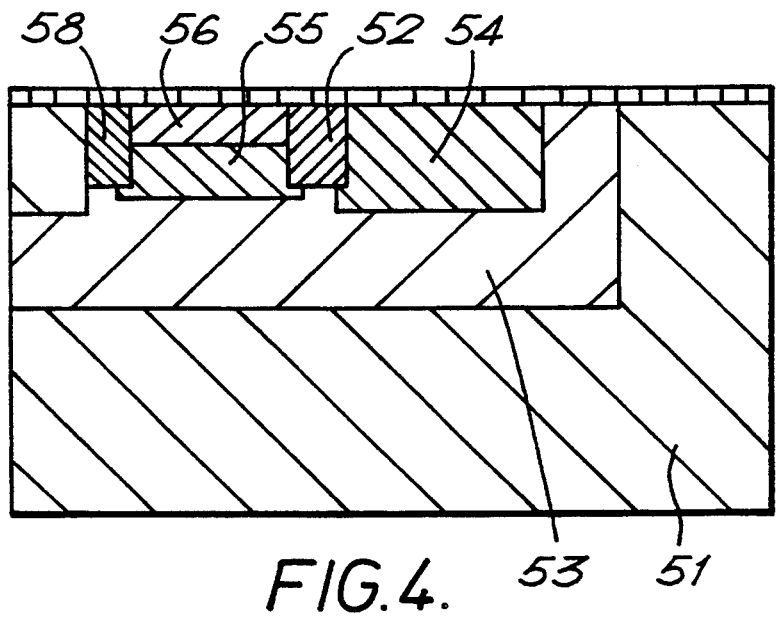
FIG. 4 is a process sectional diagram of an embodiment of manufacturing method of a solid-state image pickup device of the invention.

Next, removing the photoresist from the N type semiconductor substrate 51, a photoresist (not shown) is applied again on the N type semiconductor substrate 51. Exposing and developing the region for a fourth P type diffusion layer 58, a resist pattern is formed. Boron ions are implanted in this resist pattern. At this time, the ion implantation condition is the acceleration voltage of scores of kev and implantation dose of about $10^{13}$ cm$^{-2}$. As a result, the implantation depth of the fourth P type diffusion layer 58 is about 1 μm. Since the fourth P type diffusion layer 58 separate from the adjacent element, the threshold voltage is set higher so as not to conduct at a voltage applied at the time of operation. For this purpose, the impurity concentration of the fourth P type diffusion layer 58 is set relatively high. In particular, it should be set higher than the impurity concentration of the third P type diffusion layer 57 (FIG. 4).

As a gate dielectric film 59, sequentially, a silicon oxide film is grown to a thickness of about 50 nm by pyrogenic oxidation method. Thereon, a polysilicon film is grown to a thickness of about 600 nm by low pressure CVD method, and its sheet resistance is adjusted to about 10 Ω by phosphorus doping. On this polysilicon film, a photoresist is applied, and is exposed and developed, and a resist pattern of a transfer gate electrode 56 is formed. Using this resist pattern as the mask, a polysilicon film is subjected to reactive ion etching in a mixed atmosphere of fluorine gas and chlorofluorocarbon gas, thereby forming the transfer gate electrode 56.

Afterwards, as an interlayer film 60a, a silicon oxide film of about 200 nm in thickness is grown by pyrogenic oxidation method. To prevent lowering of a breakdown voltage due to pin hole or other defect in the polysilicon oxide film, an interlayer film 60b of silicon oxide film is stacked up in a thickness of about 100 nm by low pressure CVD method. The thickness of the polysilicon oxide film as the interlayer film 60a is about 200 nm. This value is set in order to prevent in-phase leak which may occur when a driving pulse is applied. As the interlayer film 60b of the silicon oxide film, a silicon oxide film using TEOS gas is stacked in this embodiment. When the thickness of the interlayer film 60b is defined at 100 nm, its breakdown voltage may be set at 30 V or more.

A tungsten polycide film is grown as a first light-shield film 61. A polysilicon film as the lower layer of the tungsten silicide (hereinafter called a lower layer polysilicon film) is grown by about 100 nm. The thickness of the lower layer polysilicon film is defined at 100 nm in order to prevent peeling by the stress of the tungsten silicide film grown next. (hereinafter called the upper layer tungsten silicide film) when the thickness of the lower layer polysilicon film is further thinner. The temperature at the time of growth of the lower layer polysilicon film is 900° C. or lower, and because of this low temperature growth, the impurity profile of the diffusion layer in the N type semiconductor substrate 51 is hardly changed. If the impurity profile is diffused or changed by heat, it may cause lowering of saturation output value in the reading characteristic for the solid-state image pickup device.

By the CVD method, consequently, an upper layer tungsten silicide film is grown by about 200 nm. Practically, it is obtained by the reduction reaction between the tungsten hexafluoride and hydrogen gas. At this film thickness, the light transmissivity is 0.02%. The upper layer tungsten silicide film may be formed by stacking up the tungsten silicide target by the sputtering method using discharge in an argon gas atmosphere at 200 mTorr or less, instead of the CVD method. However, in the CVD method, since the step coverage is excellent, the tungsten silicide film is not reduced in thickness in the step part at the side of the transfer gate electrode 36, and it is advantageous that a high light-shield property is shown same as in the case of a flat film.

on thus grown silicide film, a photoresist (not shown) is applied, and exposed and developed, and a resist pattern for a first light-shield film 62 is formed. Using this resist pattern as the mask, reactive ion etching is performed in a mixed atmosphere of fluorine gas and chlorofluorocarbon gas, and the first light-shield film 61 is formed.

A silicon oxide film to be used as a second interlayer dielectric film 62 is stacked up in a thickness of about 200 nm by atmosphere pressure CVD method using silane gas and oxygen. The atmosphere pressure CVD method is employed because the process may be simplified by growing simultaneously in the same apparatus as the first interlayer dielectric film 63 grown in the atmosphere pressure CVD method. For example, moreover, a silicon oxide film stacked up by the low pressure CVD method using TEOS gas may be used as the second interlayer dielectric film 62. The thickness of the second interlayer dielectric film 62 alone can achieve the following two purposes. Firstly, it offers a buffer layer for preventing generation of crystal defect in the photodiode 54 by etching damage at the time of dry etching for pattering the second light-shield film 64 in a later process. Secondly, a dielectric breakdown voltage is maintained between the transfer gate electrode 56 and the wiring layer composed of the first light-shield film 61, second light-shield film 64 and wiring layer 65. On the other hand, if the thickness of the second interlayer dielectric film 62 is increased for the above purposes, the light entering and penetrating the first light-shield film 61 from an oblique direction increases, and the smear noise is generated, and therefore it is not desired to increase the thickness more than necessary.

Figure 5:
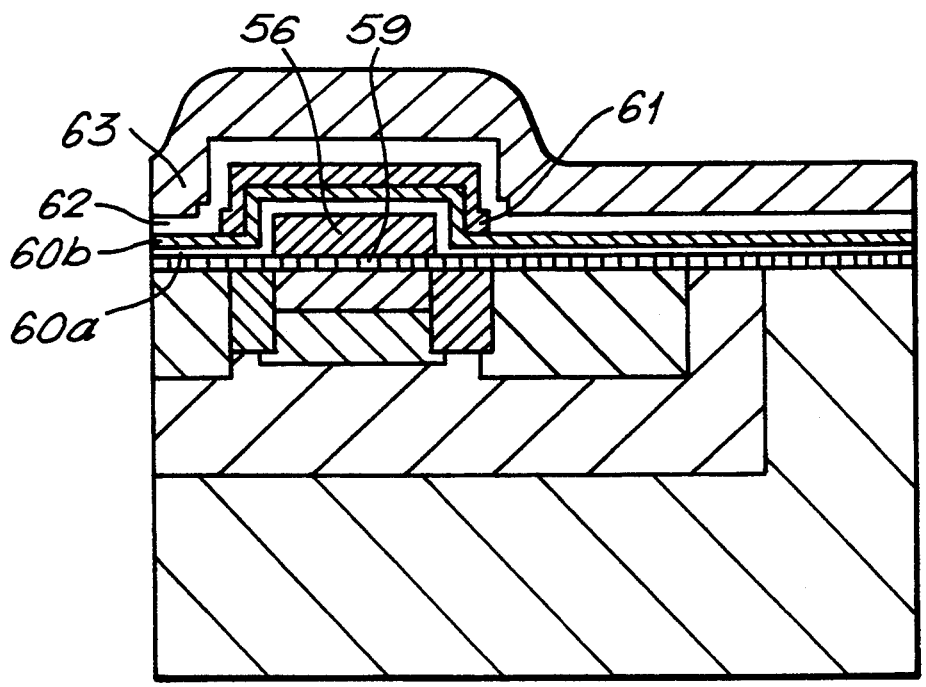
FIG. 5 is a process sectional diagram of an embodiment of manufacturing method of a solid-state image pickup device of the invention.

Consequently, a BPSG film is formed as a first interlayer dielectric film 63 by atmosphere pressure CVD method using a mixed gas of silane gas, phosphine gas and diborane gas. The mixing ration of silane gas, phosphine gas and diborane gas is determined so that the boran and phosphorus concentration of the BPSG film may be about 3 wt. % and about 6 wt. %, respectively. The thickness of this BPSG film is about 600 nm. Next, in an $N_2$ atmosphere by heat treatment at 900° C. a flow is induced in this BPSG film, and the uppermost surface of the first interlayer dielectric film 63 is flattened. As a result of viscous fluidity at this time, the thickness of the first interlayer dielectric film 63 is about 30 nm in the step area of the first light-shield film 61. By heat treatment at 900° C. or higher, the impurity profile of the diffusion layer formed so far on the N type semiconductor substrate 51 is changed, and the reading characteristic and saturation output of the solid-state image pickup device are lowered. Herein, the reason of heat treatment in $N_2$ atmosphere, instead of heat treatment in pyrogenic atmosphere where a more favorable flat shape can be obtained is that the pyrogenic molecules passing through the first interlayer dielectric film 63 and second interlayer dielectric film 62 oxidize the upper layer silicide film which composes the first light-shield film 61 to spoil the shape (FIG. 5).

A photoresist (not shown) is formed on the first interlayer dielectric film 63, and the desired contact hole region including a contact hole 66 is exposed and developed, and a resist pattern for contact hole is formed. Using this resist pattern as the mask, reactive ion etching is effected by flourohydrocarbon gas. Thus, the contact hole 66 is formed.

When heat at 900° C. in a mixed gas atmosphere of $POCl_3$ and $O_2$, a phosphorus glass fill ($P_2O_5$) film, not shown) of about 50 nm is formed on the surface of the semiconductor device. At the same time, phosphorous is diffused in solid phase from the phosphorous glass film, and an N type diffusion layer 65 is formed. This heat treatment should be preferably done at 900° C. so that the various diffusion layers formed so far on the N type semiconductor substrate 51 may not be diffused thermally. The sheet resistance of the N type diffusion layer 65 is 5 to 10 $\Omega/\square$. At this time, phosphorous is diffused in solid phase similarly on the reverse side (not shown) of the N type semiconductor substrate 51. By this phosphorus diffusion layer, a gettering layer is formed while gettering the heavy metal elements which are impurities adversely affecting the elements and crystal defect, and it is very useful. The sheet resistance of this gettering layer is also 5 to 10 $\Omega/\square$.

Figure 6:
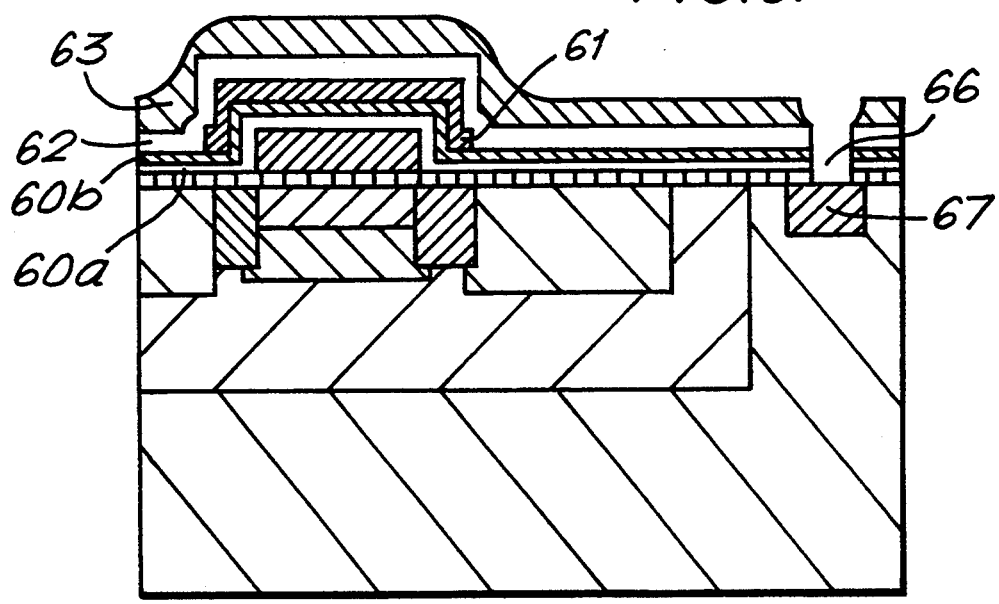
FIG. 6 is a process sectional diagram of an embodiment of manufacturing method of a solid-state image pickup device of the invention.

Consequently, using a mixed solution of hydrofluoric acid and water, the phosphorus glass film grown on the entire surface of the solid-state image pickup device is removed. The mixing ration of water:hydrofluoric acid is preferably about 20:1, from the viewpoint of controllability of etching and through-put. If the mixing ratio of hydrofluoric acid is smaller, the etching time may be extended. If the mixing ratio of hydrofluoric acid is greater, the etching controllability is impaired. The etching time at this mixing ratio may be about 20 seconds. At this time, since the first interlayer dielectric film 63 is also etched and the thickness decreases in a range of 20 nm to 40 nm, and the second light-shield film 62 may be exposed in the step area of the first-light shield film 61 (FIG. 6).

By sputtering an aluminum film containing 1% of silicon using discharging in an argon atmosphere of 20 mTorr or less, the silicon containing aluminum film is stacked up, and a photoresist is applied (not shown), and a resist pattern of second light-shield film 64 and wiring layer 65 is formed. Using this resist pattern as the mask, reactive on etching is performed in chlorine gas, and the second interlayer dielectric film 64 and wiring layer 65 are formed. By this etching, if crystal defect occurs in the photodiode 54, high temperature heat treatment at about 900° C. for recovering it cannot be applied. Hence, this etching is desired to be performed by suppressing the discharge RF power at low level so as to be low in damage.

Figure 7:
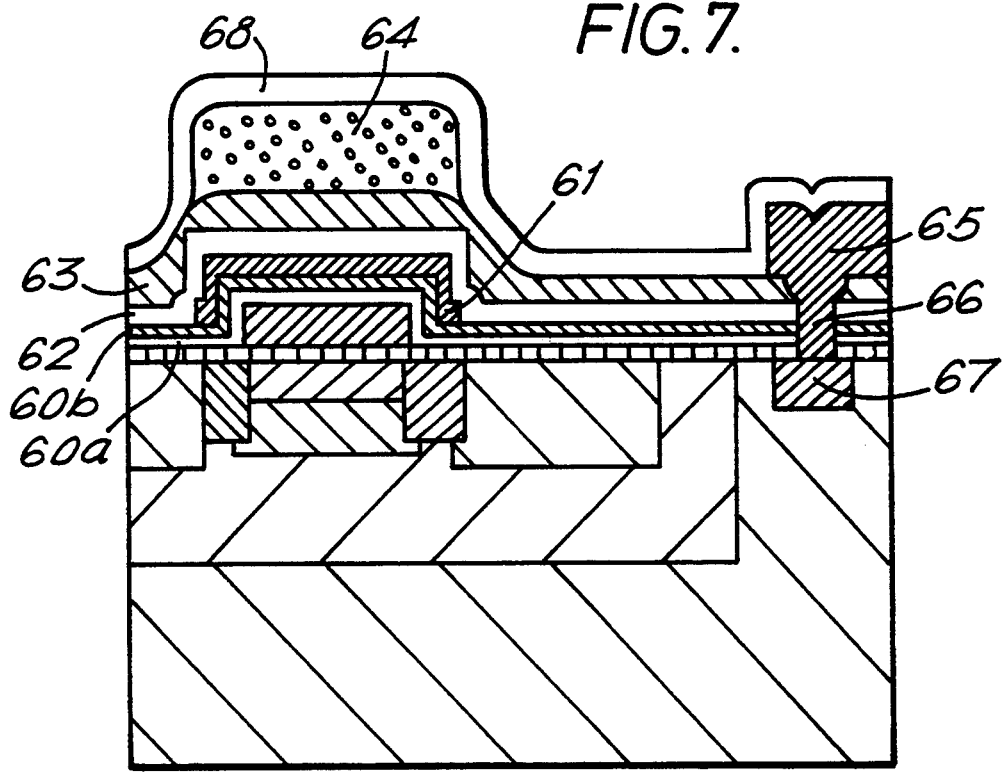
FIG. 7 is a process sectional diagram of an embodiment of manufacturing method of a solid-state image pickup device of the invention.

Finally, a silicon oxide film by plasma enhanced CVD method by a mixed gas of saline gas and $N_2O$ is stacked upon about 400 nm, and a final protective film 68 is formed, thereby completing the solid-state image pickup device of the invention (FIG. 7).

In this embodiment, as the specified etching applied on the first interlayer dielectric film 63, the wet etching process for removing the phosphorus glass film is employed, but if the specified etching is applied on the first interlayer dielectric film 63 in other process, if the etching rate of the second interlayer dielectric film 62 is slower than that of the first interlayer dielectric film 63 in this specified etching, the same effect as in the embodiment is obtained.

In this invention, meanwhile, a tungsten polycide film was used as the first light-shield film 61, but is not limitative. Any light-shield material withstanding heat treatment at around 900° C. may be used, and, for example, molybdenum polycide film having a superior light-shield property may be used.

Likewise, not limited to refractory metal polycide film, for example, refractor metal film such as tungsten and molybdenum may be used alone. In this case, since the light-shield performance is higher than in the refractor meatal polycide film, the effect on smear noise may be enhanced.

When using molybdenum silicide film or tungsten film, it can be formed in the same manner as tungsten silicide film. In the embodiment, however, in order to prevent oxidation of the refractory metal silicide film, flattening treatment of the first interlayer dielectric film the case of the BPSG film, and therefore it is necessary to reduce the step preliminarily by thinning the transfer gate electrode 56 and first light-shield film 61. Although the flattening shape may be improved by raising the heat treatment temperature or extending the heat treatment time, it is not desired because the element characteristic deteriorates by changing the impurity profile of the diffusion layer in the N type semiconductor substrate 51.

Alternatively, as the first interlayer dielectric film 63h, a film inducing growth and flattening simultaneously, such as the CVD film using ozone and TEOS gas may be used. In this case, the heat treatment for flattening at about 900° C. is not needed. Using this ozone TEOS film, the etching rate in the mixed solution of water:hydrofluoric acid of 20:1 used in the embodiment is about 150 nm/min.

In the foregoing embodiment, although the second-light shield film 64 and wiring layer 65 were formed and patterned in the sample process, this method is not limitative. For example, pure aluminum may be used as the second light-shield film 64, and a silicon-containing aluminum, silicon and copper-containing aluminum may be used as the wiring layer 65. In this case, the second light-shield film 64 and wiring layer 65 are manufactured in separate steps. Since both layouts do not cross on a plane, it is not necessary to form a new interlayer dielectric film between the two. In this case, the same film forming and patterning processes as in the embodiment may be repeated once more.

Figure 8:
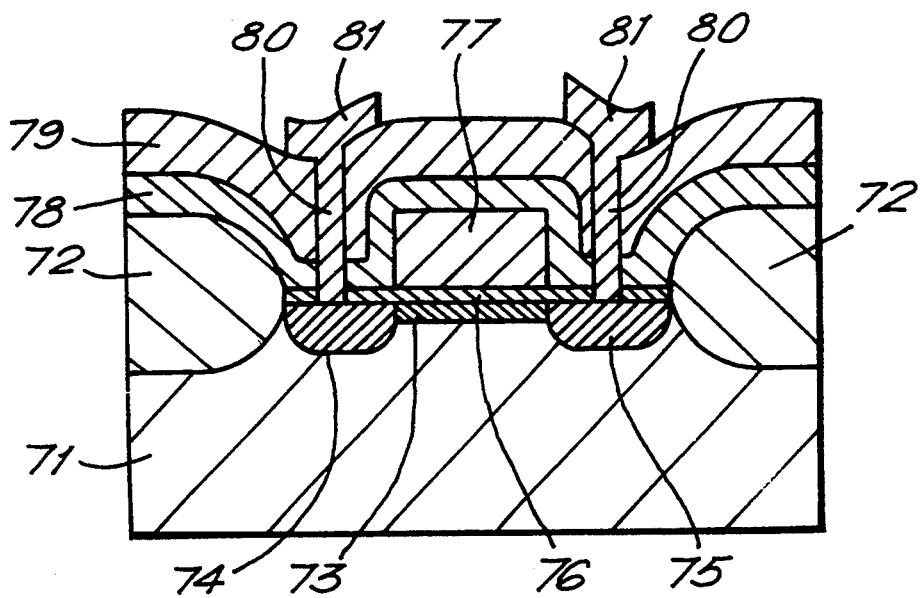
FIG. 8 is a sectional view of an embodiment of a semiconductor device of the invention.
Figure 9:
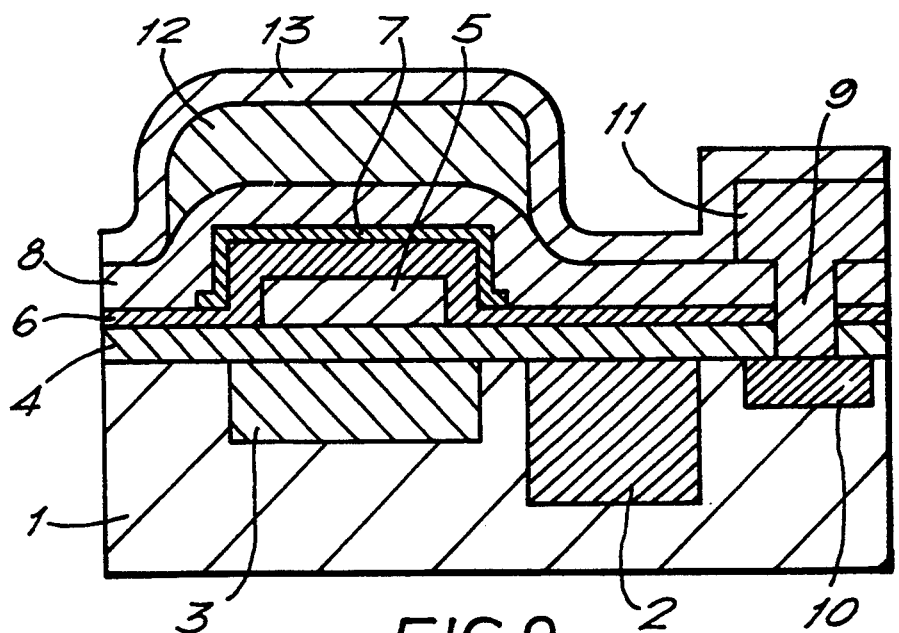
FIG. 9 is a sectional view of a conventional solid-state image pickup device.
Figure 10A:
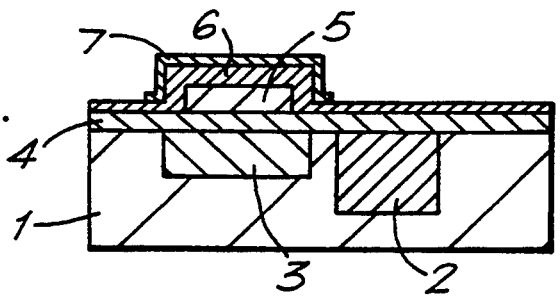
FIG. 10(a)–10(e) is a process sectional view of a manufacturing method of a conventional solid-state image pickup device.
Figure 10B:
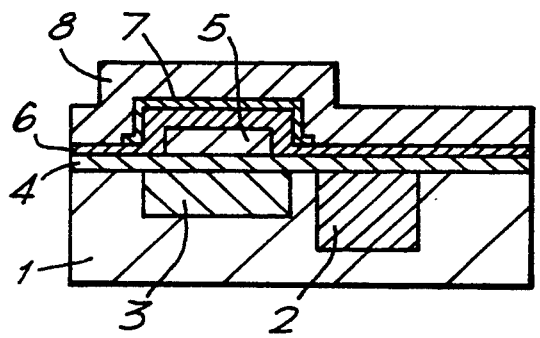
Figure 10C:
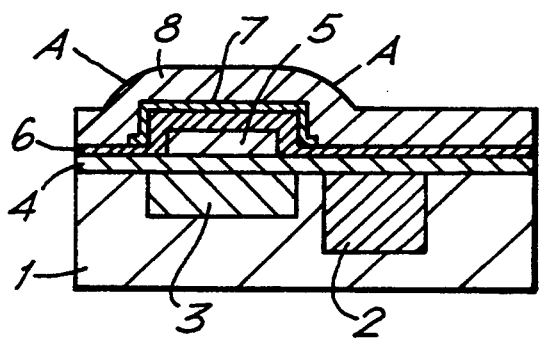
Figure 10D:
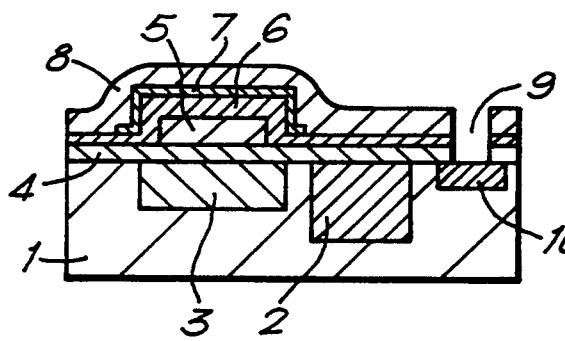
Figure 10E:
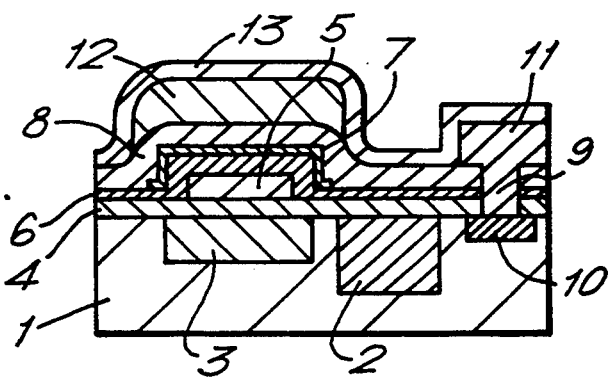

So far is explained the embodiment using the solid-state image pickup device, but in other semiconductor devices, too, the interlayer dielectric film may be reduced in thickness by forming an interlayer dielectric film having a multilayer structure. This point is discussed in detail in FIG. 8. FIG. 8 is a section view of a MOS transistor which cia a semiconductor device in a second embodiment.

Explained below are the structure and operation of the MOS transistor according to the constitution of the semiconductor device of the invention.

On the semiconductor substrate 71 possessing a first. conductivity, the element separating region 72 for electrically separating the specified region (active region) for a MOS transistor is formed. Near the surface of the semiconductor substrate 71 in this active region, the channel diffusion layer 73 for obtaining a specific threshold voltage is formed. The source diffusion layer 74 having a second conductivity opposite to the conductivity of the semiconductor substrate 71 and the drain diffusion layer 75 ar formed separately from each other, and the both diffusion layers are joined to the channel diffusion layer 73. On the channel diffusion layer 73, a gate electrode 77 is formed on the gate dielectric film 76. On the gate electrode, 77, the first interlayer dielectric film 78 and second interlayer dielectric film 79 are sequentially stacked up and formed. By this stacked dielectric film, the gate electrode 77 and wiring layer 81 are formed. The first interlayer dielectric film 78 is made of a material of which etching rate to the second interlayer dielectric film 79 is sufficiently small in the specified etching, and the second interlayer dielectric film 79 has a flattened uppermost surface. The source diffusion layer 74 and drain diffusion layer 75 are connected to the wiring layer 81 through contact holes 80. The contact holes 80 penetrate all layers of the gate dielectric film 76, first interlayer dielectric film 78, and second interlayer dielectric film 79. A specified voltage is applied through the wiring layer 81. The ON state and OFF state of the MOS transistor are determined by the voltage applied to the gate electrode 77 and the specified voltage applied from the wiring layer 81.

Next is explained the detail of the constitution of the interlayer dielectric film in double structure consisting of the first interlayer dielectric film 78 and second interlayer dielectric film 79, together with its effects. The second interlayer dielectric film 79 is formed by flattening its uppermost surface in a desired shape. The first interlayer dielectric film 78 is characterized by the etching rate to the specified etching applied for flattening the first interlayer dielectric film 79. With respect to the specified etching, the first interlayer dielectric film 78 has a sufficiently lower etching rate as compared with the second interlayer dielectric film 79. Herein, concerning a practical constitution, same as in the first embodiment, for example, for NSG film is used for the first interlayer dielectric film 78 and BPSG film for the second interlayer dielectric film 79. In the interlayer dielectric film having such double layer structure, even by specified etching, the first interlayer dielectric film 78 is not etched. That is, in the MOS transistor, when the gate electrode 77 is formed, a step is formed on the substrate. In this step area, when stacking up the second interlayer dielectric film 79, the film thickness is thinner than in the flat area. If uniform etching is done in this state, the second interlayer dielectric film 79 which is a swollen part thinner than the surrounding film thickness will disappear. When the second interlayer dielectric film 78 disappears, the etching proceeds to the lower layer of the first interlayer dielectric film 78. However, the first interlayer dielectric film 78 has a higher etching resistance than the second interlayer dielectric film 79, and is not etched. Hence, only by forming the first interlayer dielectric film 78 in thickness for realizing a specific interlayer dielectric breakdown voltage, the second interlayer dielectric film 79 may be formed in a minimum film thickness for obtaining a desired flat shape, regardless of the interlayer dielectric breakdown voltage.

Moreover, since the first interlayer dielectric film 78 functions to stop the specified etching, the film thickness fluctuations of the interlayer dielectric film in double layer composition may be suppressed.

Aside from the typical MOS transistor disclosed in this embodiment, various MOS transistors can be composed, and similar effects are brought about by the interlayer dielectric film in double layer composition in the invention. The embodiment relates to an example of MOS transistor having two conductive layers in the upward direction of the semiconductor device, but in the MOS transistor possessing three or more conductive layers in the upward direction of the semiconductor device, the interlayer dielectric film in double layer composition of the invention may be similarly applied, and the same effects are obtained.

In these two foregoing embodiments, the BPSG film was used as the first interlayer dielectric film and the NSG film using atmosphere pressure CVD for the second interlayer dielectric film, but these materials are not limitative. For example, as the first interlayer dielectric film, a material that can be flattened by heat treatment, such as phosphosilicate glass (PSG) film may be used. In the embodiment, after stacking up the first interlayer dielectric film, the uppermost surface is flattened by heat treatment, but this processing is not limitative, and, for example, the first interlayer dielectric film may be formed by using a material which simultaneously promotes stacking and flattening of uppermost surface, such as the $SiO_2$ stacked up by the atmosphere pressure CVD method or low pressure CVD using a mixed gas of ozone ($O_3$) and TEOS ($Si(CO_2H_5)_4$). Or, as the second interlayer dielectric film, a material of a dense film texture is suited, and, for example, silicon nitride film and silicon oxy-nitride film may be used.

In these two embodiments, meanwhile, the interlayer dielectric film is composed in two-layer structure of first interlayer dielectric film and second interlayer dielectric film, but the interlayer dielectric film may be composed of three or more layers as far as the first interlayer dielectric film and second interlayer dielectric film of the invention are included as the constituent elements.

In the semiconductor device of the invention, the first interlayer dielectric film having the uppermost surface formed as a material flattened in a desired shape is provided in the upper layer, and the second interlayer dielectric film formed using a material of which etching rate on the first interlayer dielectric film in the specified etching is sufficiently small is provided in the lower layer, and a multiple-layer interlayer dielectric film is composed, in which the first interlayer dielectric film is eliminated by the specified etching, and if the specified etching reaches up to the second interlayer dielectric film, the thickness of the second interlayer dielectric film does not decrease. Therefore, forming the first interlayer dielectric film in thickness for the specified interlayer dielectric breakdown voltage, the second interlayer dielectric film may be formed in a minimum film thickness within a range for a desired flattened shape without consideration of the specified interlayer dielectric breakdown voltage, and at the same time the film thickness fluctuations of the interlayer dielectric film double layer composition may be suppressed.

Although the present invention has been described in considerable detail with reference to certain preferred versions, other versions are possible.

Therefore, the spirit and scope of the appended claims should not be limited to the description of the preferred versions contained herein.

What is claimed is:

1. A solid state image pickup device comprising:
    a semiconductor substrate;
    a photodiode formed on said semiconductor substrate;
    a transfer channel formed on said semiconductor substrate at a specific gap to the photodiode;
    a gate dielectric film formed on said semiconductor substrate;
    a transfer gate electrode formed on said gate dielectric film;
    an interlayer film formed on said transfer gate electrode;
    a first light shield film formed on said interlayer film form shielding the transfer channel from light;
    an interlayer dielectric film formed on said first light shield film;
    a second light shield film formed on the interlayer dielectric film; and
    where the interlayer dielectric film is composed of multi-layer film of at least first interlayer dielectric film and second interlayer dielectric film;
    said second interlayer dielectric film is smaller in the etching rate than said first interlayer dielectric film in an etching process of both the first and second interlayer dielectric films, and the second interlayer dielectric film is formed beneath the first interlayer dielectric film.

2. A solid-state image pickup device according to claim 1, wherein said second interlayer dielectric film is a silicon oxide film, and said first interlayer dielectric film is a silicon oxide film containing at least one of boron and phosphorus.

3. A solid-state image pickup device according to claim 2, wherein a voltage applied to said transfer gate electrode is operated by four-phase driving pulses.

4. A solid-state image pickup device according to claim 2, wherein a P type diffusion layer is provided so as to surround the transfer channel, thereby forming an Hi-C structure.

5. A solid state image pickup device according to claim 2, wherein said interlayer films are formed in a multiple layer film of polysilicon oxide film and silicon oxide film.

6. A solid-state image pickup device according to claim 2, wherein said first light-shield film is formed in a multiple layer film of polysilicon film and tungsten silicide film.

* * * * *